(12) United States Patent
DeBrabander et al.

(10) Patent No.: US 8,641,171 B2
(45) Date of Patent: Feb. 4, 2014

(54) FORMING NOZZLES

(75) Inventors: Gregory DeBrabander, San Jose, CA (US); Mark Nepomnishy, San Jose, CA (US)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/484,117

(22) Filed: May 30, 2012

(65) Prior Publication Data

US 2012/0234946 A1  Sep. 20, 2012

Related U.S. Application Data

(62) Division of application No. 12/346,698, filed on Dec. 30, 2008, now Pat. No. 8,197,029.

(51) Int. Cl.
*B41J 2/135* (2006.01)

(52) U.S. Cl.
USPC ................. 347/44; 347/45; 347/46; 347/47; 347/68

(58) Field of Classification Search
None
See application file for complete search history.

(56) References Cited

U.S. PATENT DOCUMENTS

| | | | |
|---|---|---|---|
| 3,921,916 A | 11/1975 | Bassous | |
| 4,106,976 A | 8/1978 | Chiou et al. | |
| 4,422,082 A | 12/1983 | Louzil | |
| 4,685,198 A * | 8/1987 | Kawakita et al. | 438/410 |
| 5,308,442 A | 5/1994 | Taub et al. | |
| 6,123,413 A | 9/2000 | Agarwal et al. | |
| 6,171,510 B1 | 1/2001 | Lee | |
| 6,214,245 B1 | 4/2001 | Hawkins et al. | |
| 6,238,584 B1 | 5/2001 | Hawkins et al. | |
| 6,407,002 B1 | 6/2002 | Lin et al. | |
| 6,974,991 B2 * | 12/2005 | Cheng et al. | 257/302 |
| 7,121,650 B2 | 10/2006 | Chung et al. | |
| 7,347,532 B2 | 3/2008 | Chen et al. | |
| 2002/0118253 A1 | 8/2002 | Ohno et al. | |
| 2005/0099467 A1 | 5/2005 | Bibl et al. | |
| 2007/0221617 A1 | 9/2007 | Takahashi | |
| 2008/0242099 A1 * | 10/2008 | Yi | 438/704 |
| 2008/0309718 A1 | 12/2008 | Oya et al. | |

FOREIGN PATENT DOCUMENTS

| | | |
|---|---|---|
| JP | 51-084641 | 7/1976 |
| JP | 2007320254 | 12/2007 |
| JP | 2008-049673 | 6/2008 |

OTHER PUBLICATIONS

Office action mailed Jun. 26, 2013 in Japanese Patent Application No. 2009-289210 and partial English translation, 7 pgs.

* cited by examiner

*Primary Examiner* — Duy Deo

(74) *Attorney, Agent, or Firm* — Fish & Richardson P.C.

(57) ABSTRACT

Fluid ejection nozzles having a tapered section leading to a straight walled bore are described. Both the tapered section of the nozzle and the straight walled bore are formed from a single side of semiconductor layer so that the tapered section and the bore are aligned with one another, even when an array of nozzles are formed across a die and multiple dies are formed on a semiconductor substrate.

4 Claims, 14 Drawing Sheets

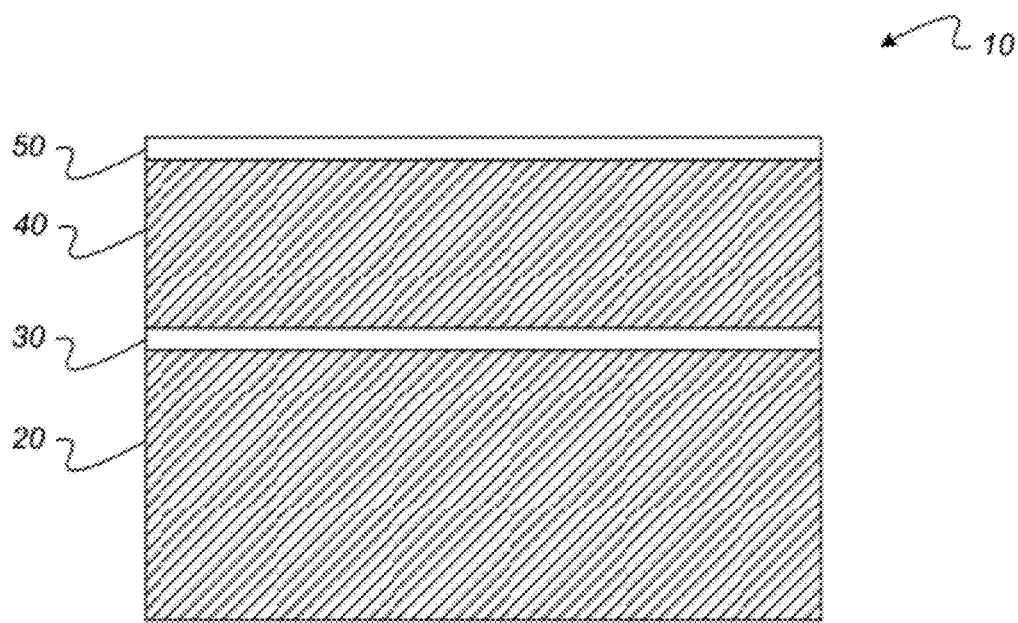
FIG._1
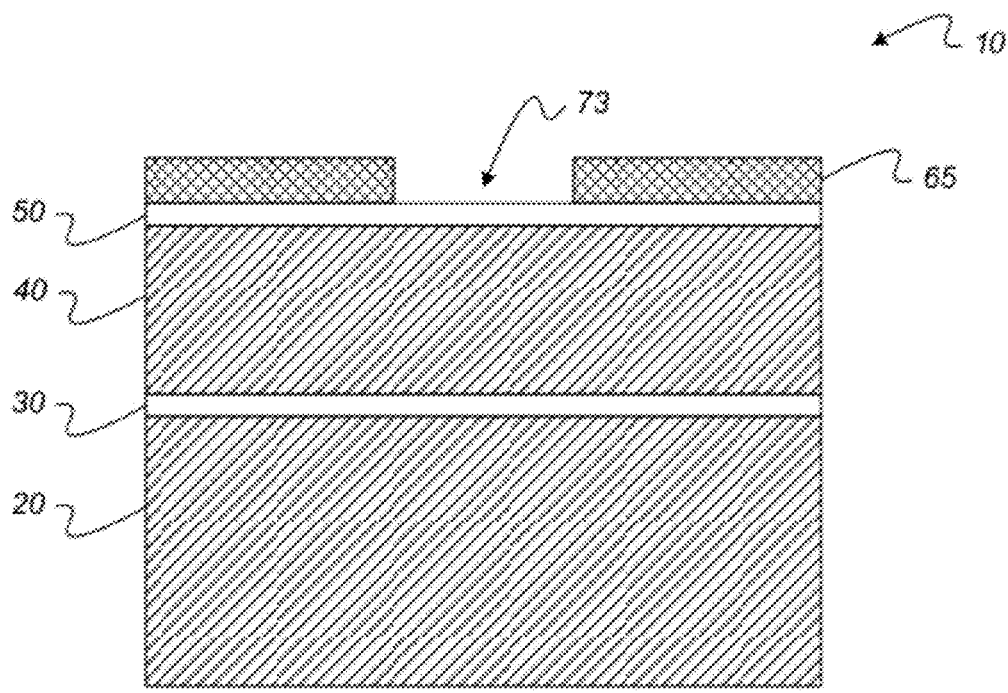
FIG._2

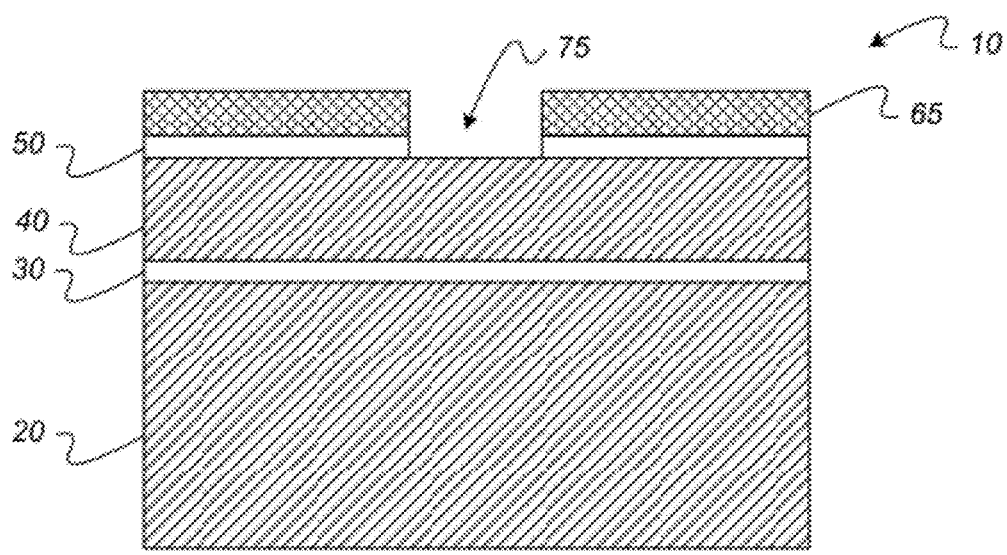
FIG._3
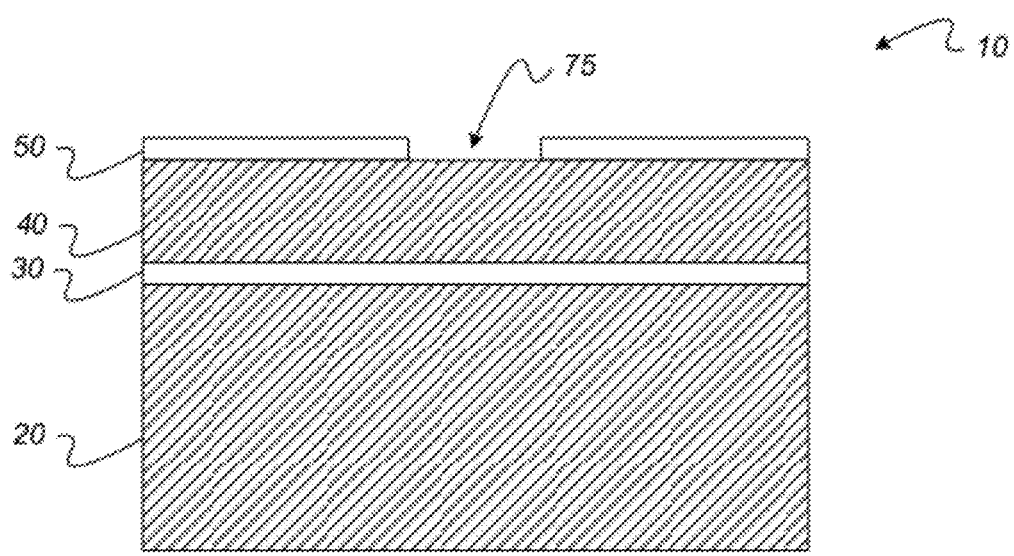
FIG._4

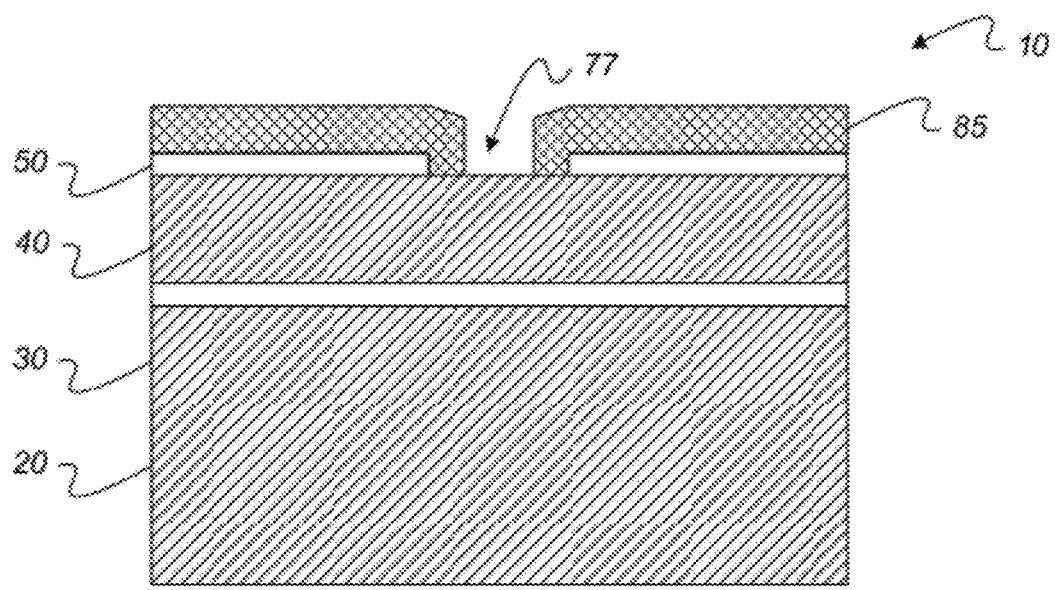
FIG._5
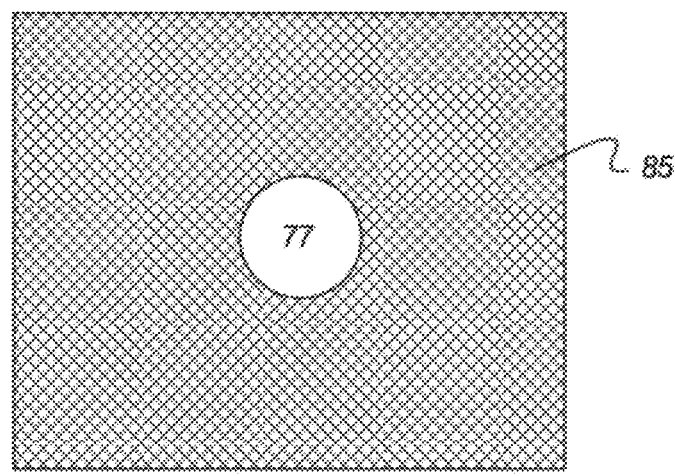
FIG._6

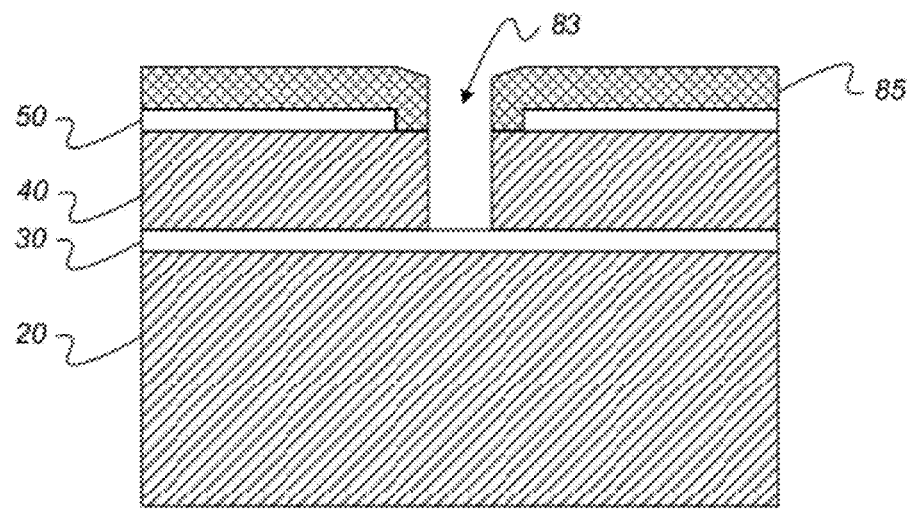
FIG._7
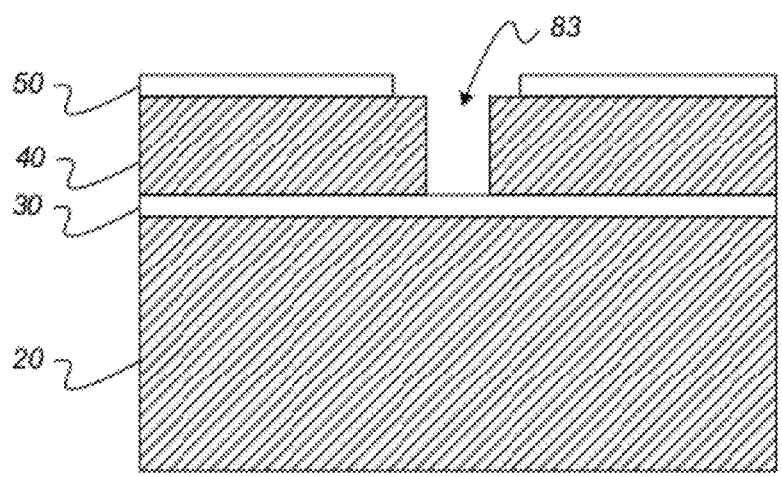
FIG._8

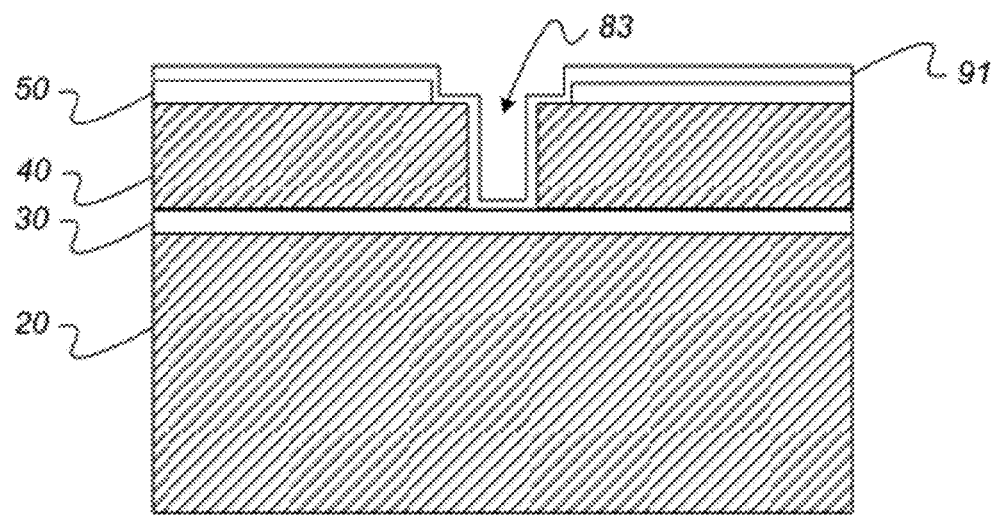
FIG._9
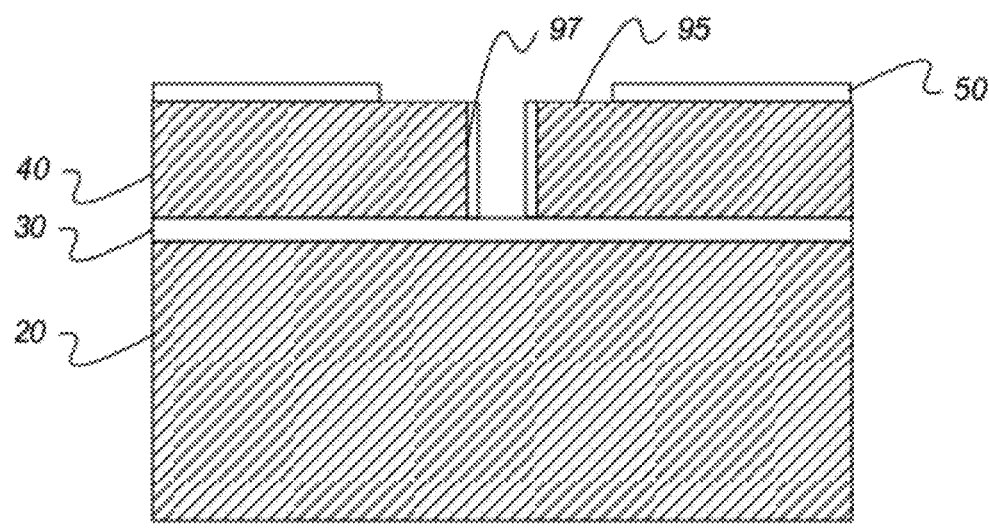
FIG._10

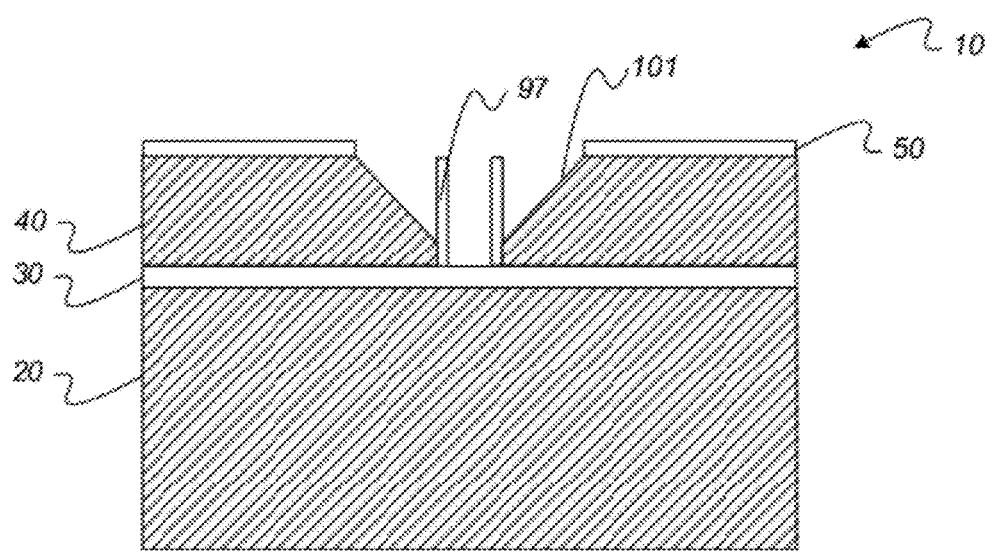
FIG._11
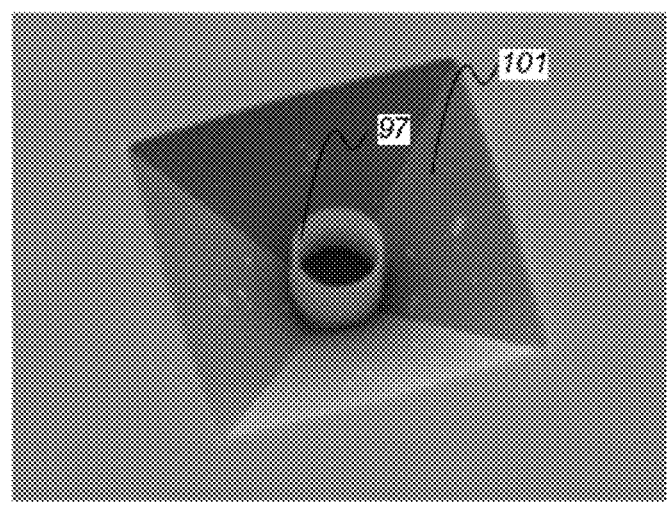
FIG._12

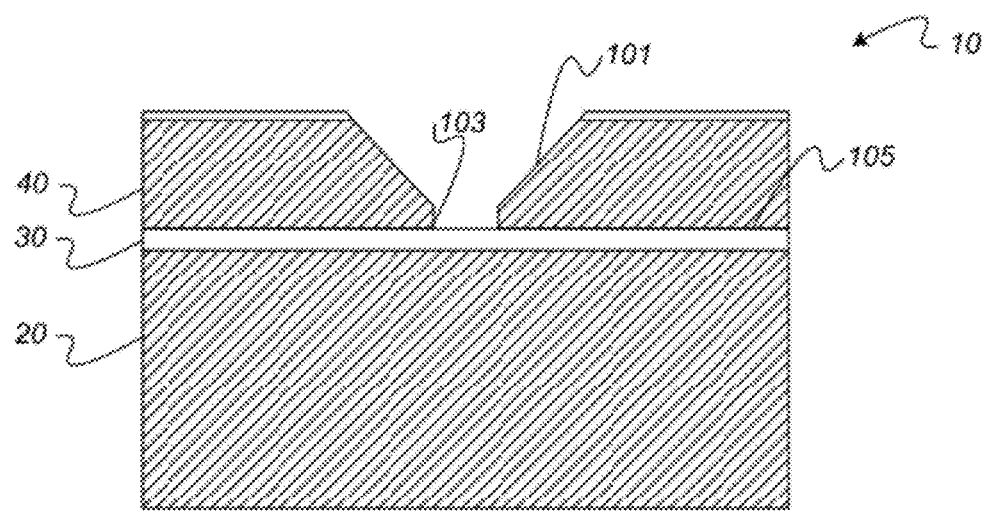
FIG._13
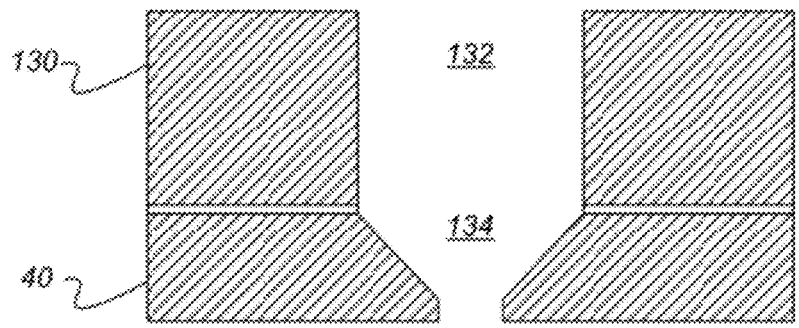
FIG._14
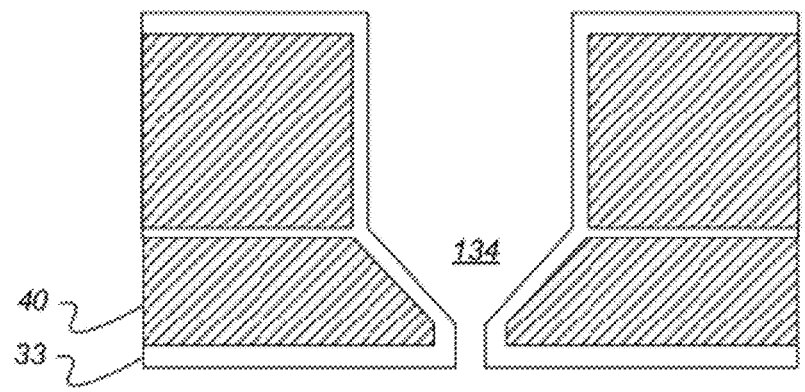
FIG._15

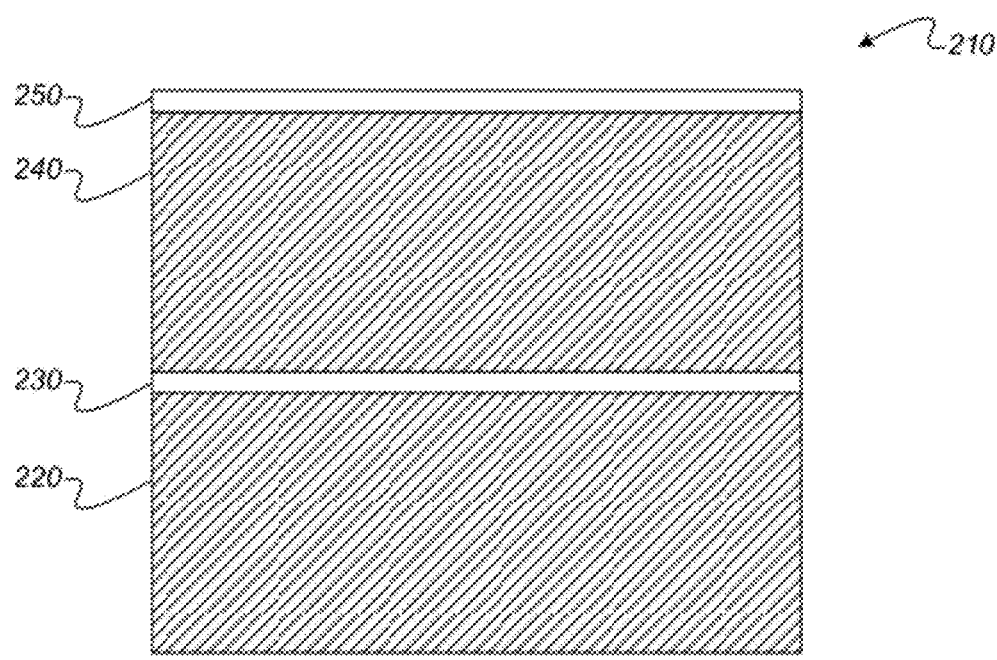
FIG._16
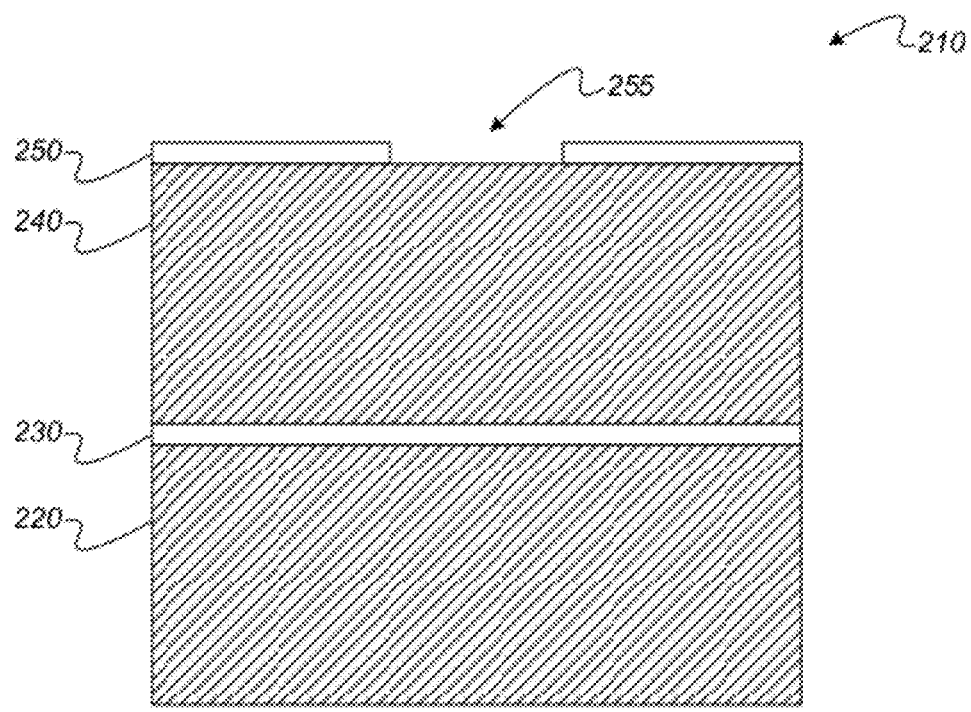
FIG._17

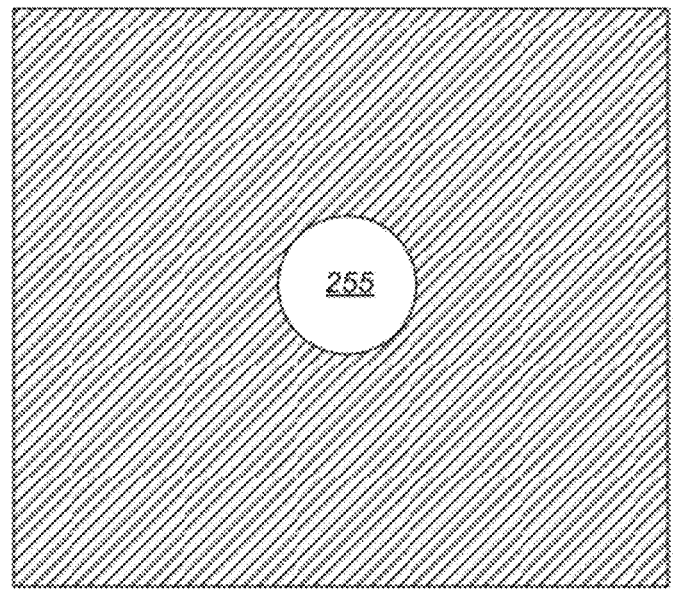
*FIG._18*
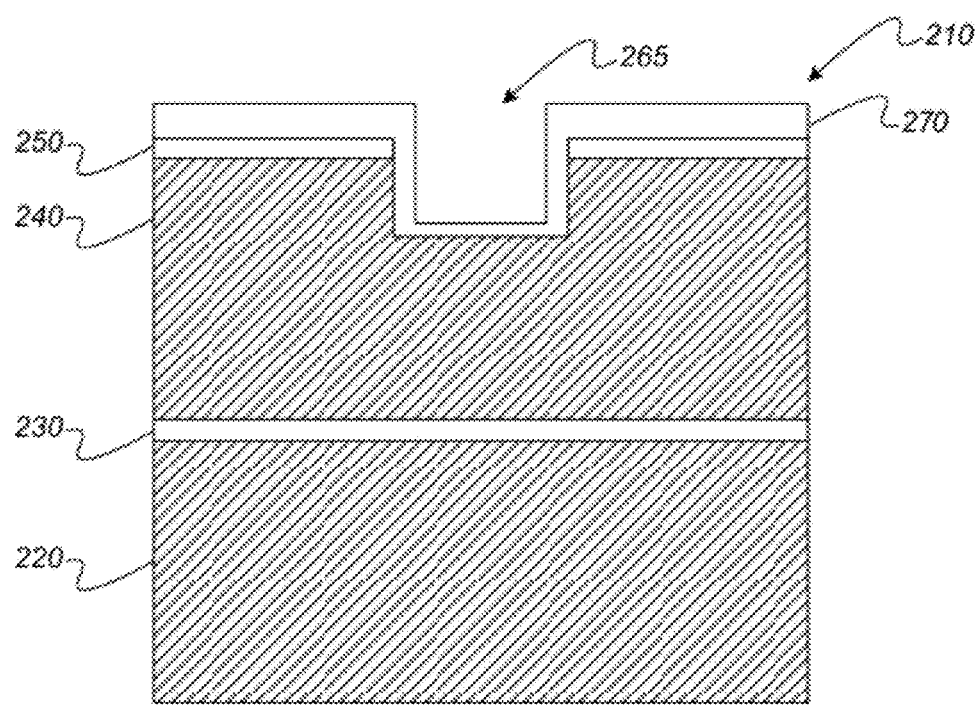
*FIG._19*

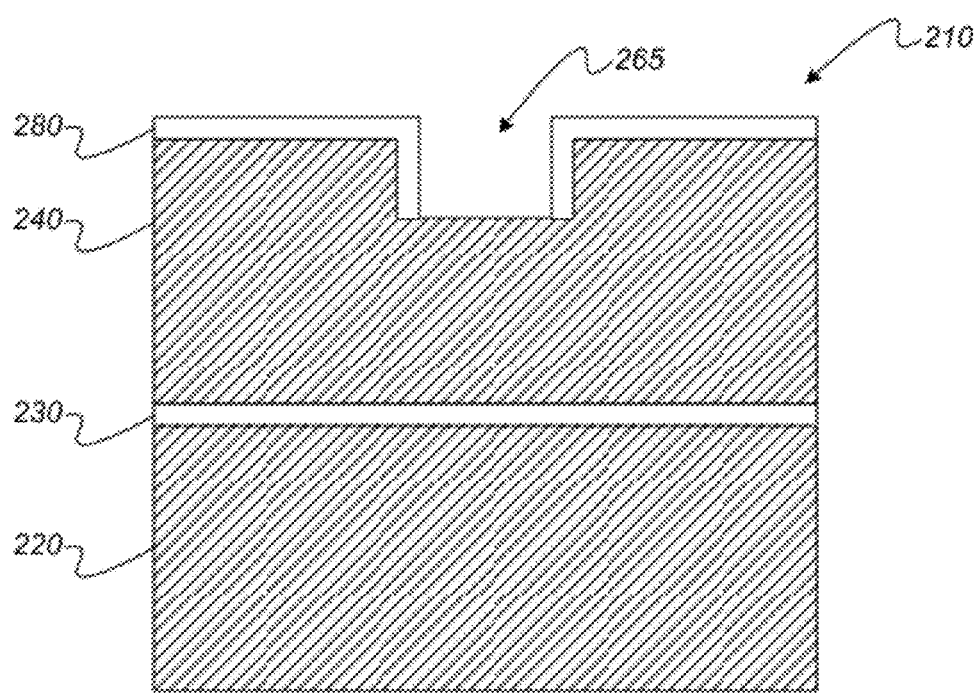
FIG._20
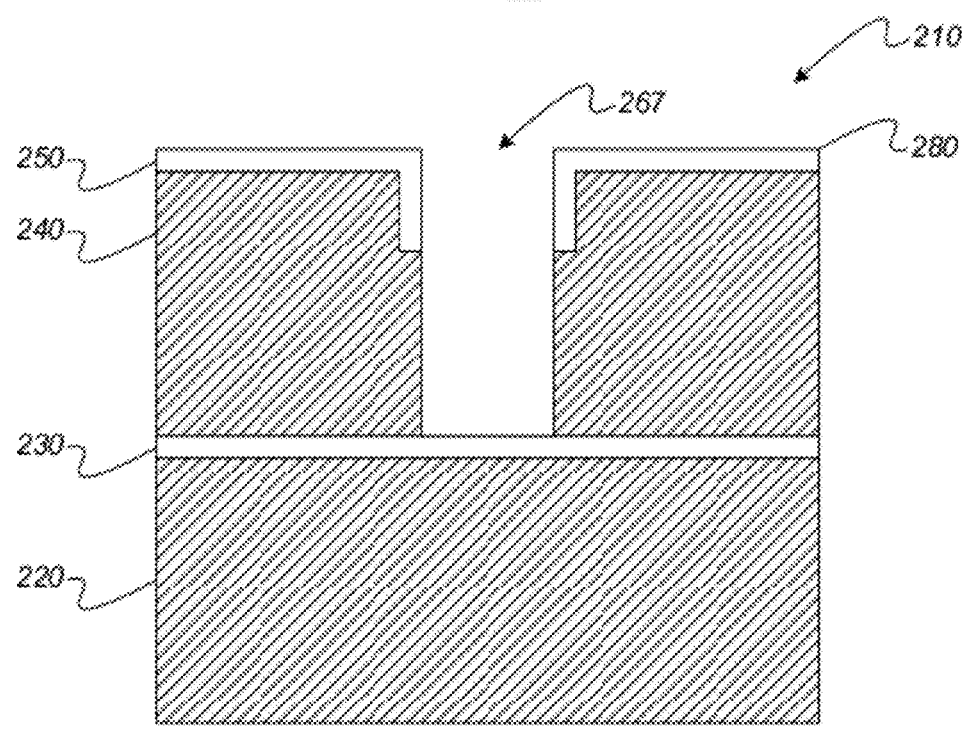
FIG._21

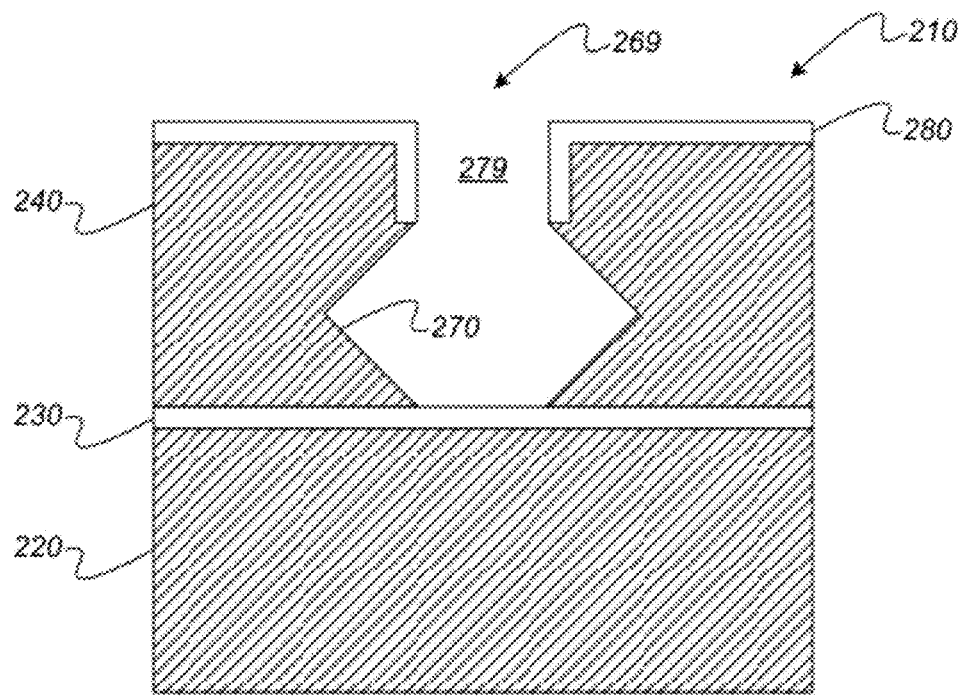
FIG._22
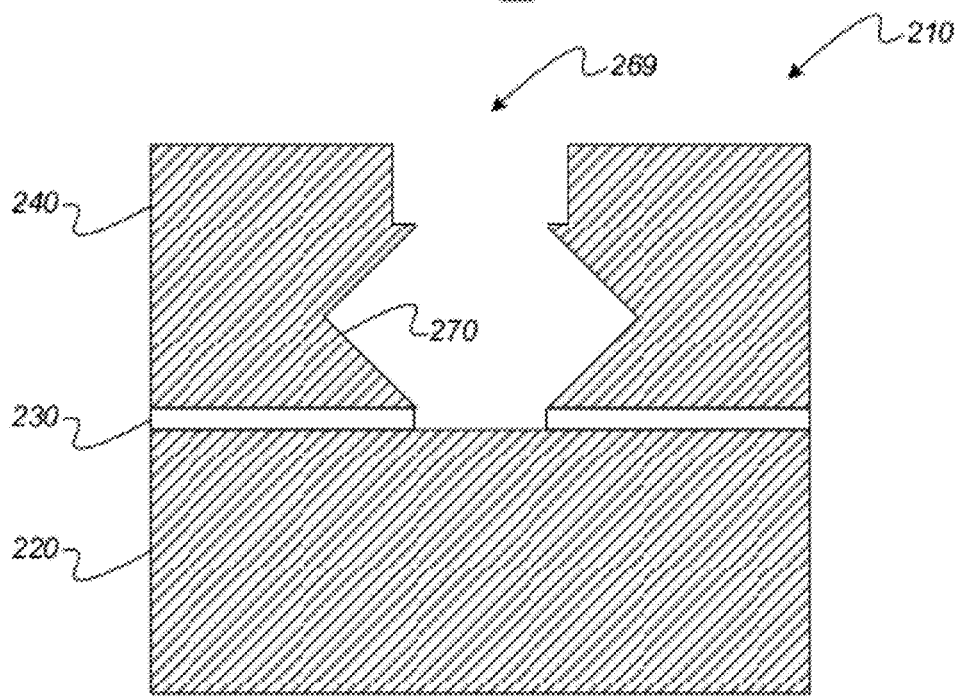
FIG._23

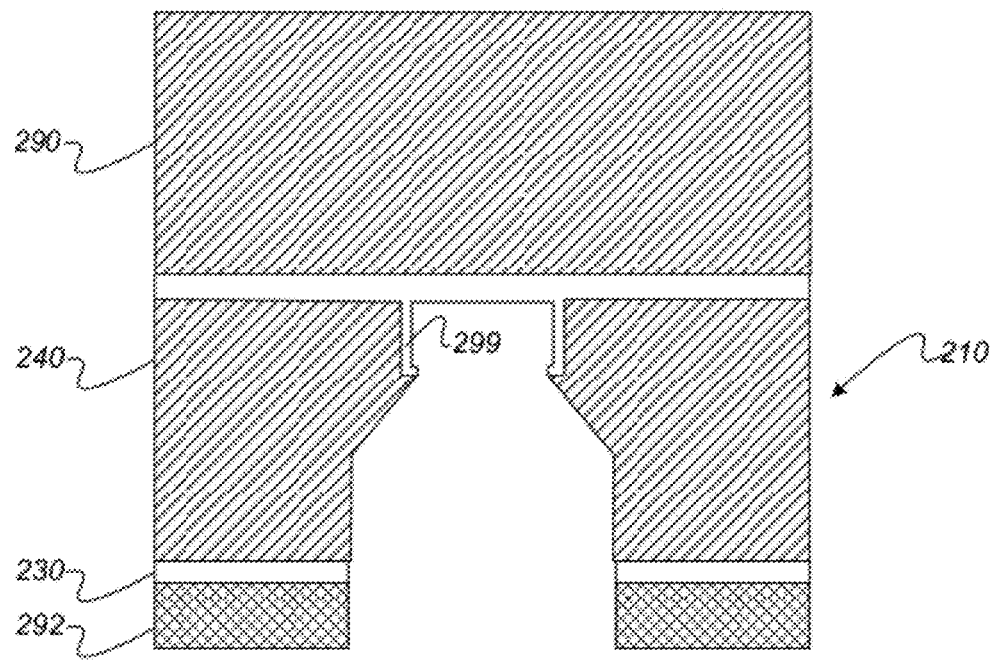
FIG._26
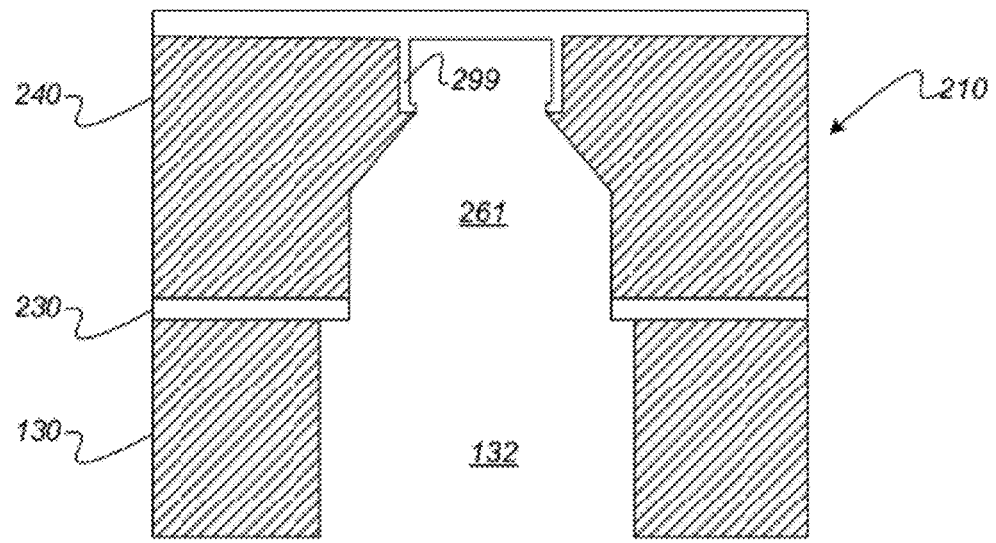
FIG._27

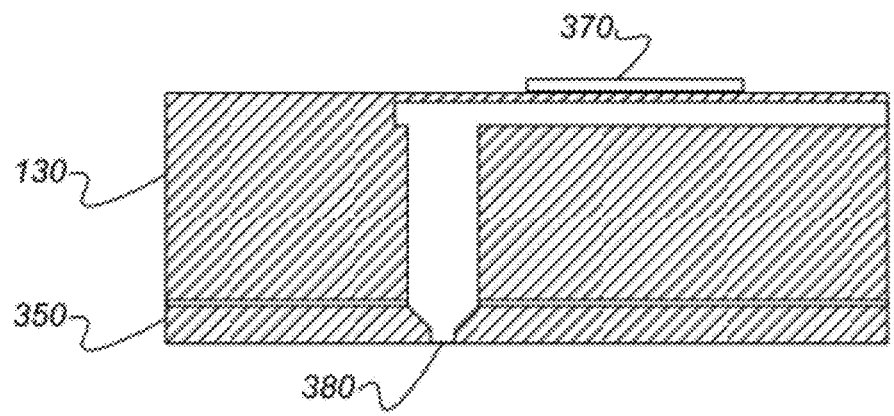
FIG._28
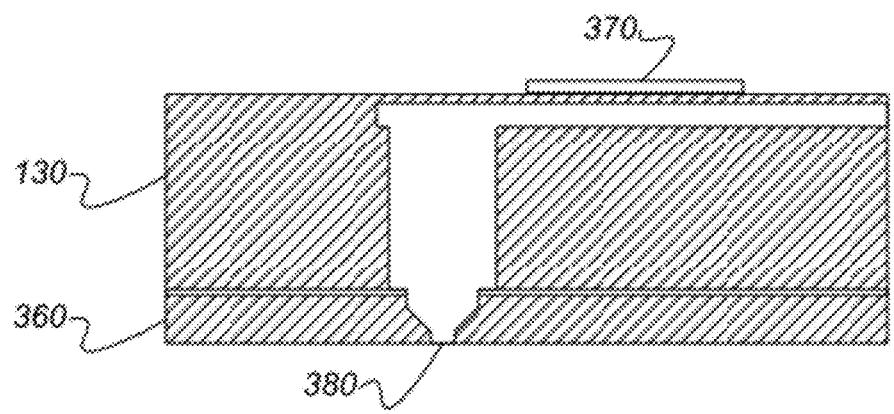
FIG._29

FORMING NOZZLES

CROSS-REFERENCE TO RELATED APPLICATIONS

This application is a divisional of U.S. application Ser. No. 12/346,698, filed Dec. 30, 2008, which is incorporated by reference.

TECHNICAL FIELD

This invention relates to forming etched features in a semiconductor material.

BACKGROUND

Dies having multiple structures for jetting fluid can be formed in semiconductor material. Each structure can include a fluid path that leads to a nozzle. An actuator forces fluid in the flow path out the nozzles when actuated. Some types of nozzles have a tapered portion that leads to an oval or circular outlet. To form the die, an array of nozzles can be partially formed in a nozzle plate that is attached to a device body in which the fluid path is located. In forming a device, the nozzle plate can be formed separate from the device body. In some devices, the tapered portion is formed in the nozzle plate prior to attaching the nozzle plate to the device body. The circular holes are then formed in the nozzle plate after attaching the nozzle plate to the device body. Circular nozzles in a nozzle plate have more uniform ejection qualities, such as drop volume and ejection direction, than nozzles with a rectangular or square shape.

SUMMARY

In one aspect, a method of forming a nozzle plate is described. The method includes etching a first side of a semiconductor layer to form a tapered feature, wherein the semiconductor layer is part of a multilayer substrate and an etch stop layer is adjacent to the semiconductor layer and etching the first side of the semiconductor substrate to form a straight walled feature wherein walls of the straight walled feature intersect walls of the tapered feature and the walls of the straight walled feature are perpendicular to a surface of the first side of the semiconductor layer.

In another aspect, a method of forming a nozzle plate of a fluid ejection device is described that includes etching a first surface of a semiconductor layer to form a straight walled feature that extends vertically and only part way to an etch stop layer adjacent to the semiconductor layer. A protecting layer is applied on sidewall surfaces of the straight walled feature. A bottom of the straight walled feature is etched to extend the feature to the etch stop layer and to form a bore. Side surfaces of the bore are extended to cause a portion of the bore to widen.

Fluid ejection devices are described. In one aspect a device includes a silicon body having a descender formed therein. A nozzle plate has a nozzle formed therein, wherein the nozzle has an inlet adjacent to the descender, the inlet having walls that are substantially parallel to one another, the inlet leading to a tapered section, the tapered section leading to a passage and the passage leading to an outlet, wherein the inlet is in fluid communication with the descender but has a cross sectional dimension different from the descender.

Embodiments of the techniques described herein may include one or more of the following. A cross section of the straight walled features may be either circular or oval and the straight walled feature may extend to the etch stop layer. A cross section of the straight walled feature parallel to the first side may be less than a cross section of the tapered feature parallel to the first side. The straight walled feature may be etched prior to etching to form the tapered feature and a location of the straight walled feature in the semiconductor layer may be used to position the tapered feature. Etching the first side of the semiconductor substrate to form a straight walled feature may include etching a topside layer of oxide or nitride on the first side of the semiconductor substrate to form a mask with a first aperture having a round or oval shape. An overcoat layer of oxide or nitride may be to walls of a hole formed in the semiconductor layer. An overcoat layer of oxide or nitride may be applied to the topside layer and to walls of a hole formed in the semiconductor layer, wherein the hole has a cross section substantially equal to a cross section of the first aperture and subsequently part of the overcoat layer may be removed to leave a sidewall layer of oxide or nitride and the topside layer and to expose the semiconductor layer around the hole. Etching a first side of a semiconductor layer may include etching the semiconductor layer in a region that is exposed around the hole to form the tapered feature. Etching the semiconductor layer may leave a cylindrical tube of oxide between the hole and the tapered feature. The tube of oxide may be removed. Etching to form the tapered feature may form a square pyramid. Etching the semiconductor layer may include etching a silicon layer. Etching the semiconductor layer may include etching a silicon layer that is about 50 microns thick or less. The straight walled feature may be round and the bore may be substantially cylindrical. Extending side surfaces of the bore may include forming walls that are not parallel to walls of the bore. Extending side surfaces of the bore may include performing an anisotropic etch. Extending side surfaces of the bore may also include etching from a second surface of the semiconductor layer that is opposite to the first surface to form walls that are parallel to walls of the bore. Etching a first surface of a semiconductor layer can include etching silicon. The inlet can have a square cross section. The descender can be wider than the inlet of the nozzle. The passage can be cylindrical.

The methods described herein may provide one or more of the following advantages. A bore and a tapered portion of a nozzle can both be formed by etching a layer of semiconductor material from a single side, rather than from opposite sides of the layer. The cylindrical bore may therefore be easier to align with the tapered portion. If the tapered portion and circular portion are etched from a single side prior to bonding the nozzle plate to a device body, alignment problems associated with shifting of a distance from one feature to a next feature along a plane due to deformation when the nozzle plate is attached to a device body can be avoided. If nozzles in an array of nozzles have circular outlets, there may be more consistency, e.g., in nozzle size and fluid ejection performance, across a series of outlets than when the nozzles are formed with square outlets. This is because etching to form circular outlets can be done by a method that is indifferent to the crystal planes of the layer. If the nozzles in an array are uniformly sized, the size of droplets that are jetted from each nozzle can be more uniform. Uniformly sized droplets can improve jetting precision and image quality when the nozzle is part of a printing device. In addition, square nozzles can have a surface tension across the meniscus that is not uniform, especially near the corners of the square shape nozzle opening. Lack of uniformity can cause inaccurate jetting direction. A circular outlet may allow for a more accurate and more uniform jetting direction of fluid drops. The tapered portion of the feature may be precisely aligned with the cylindrical portion. Alignment can allow the droplet to be ejected perpendicular to the nozzle plate surface. If the cylindrical bore and tapered portion are not aligned with one another, droplet ejection may be at an angle. Further, if the alignment is not consistent across an array of nozzles, the ejection direction across the array may not be consistent. Better alignment and more consistent quality of alignment therefore can result in more consistent direction of droplet ejection and improved image quality.

The details of one or more embodiments of the invention are set forth in the accompanying drawings and the description below. Other features, objects, and advantages of the invention will be apparent from the description and drawings, and from the claims.

DESCRIPTION OF DRAWINGS

FIGS. 1-15 illustrate the steps of one embodiment of a method of forming a nozzle plate and attaching it to a device layer.

FIGS. 16-27 illustrate the steps of another embodiment of a method of forming a nozzle plate and attaching it to a device layer.

FIGS. 28-29 illustrate a nozzle plate adhered to a device body.

Many of the layers and features are exaggerated to better show the process steps and results. Like reference symbols in the various drawings indicate like elements.

DETAILED DESCRIPTION

Figure 24:
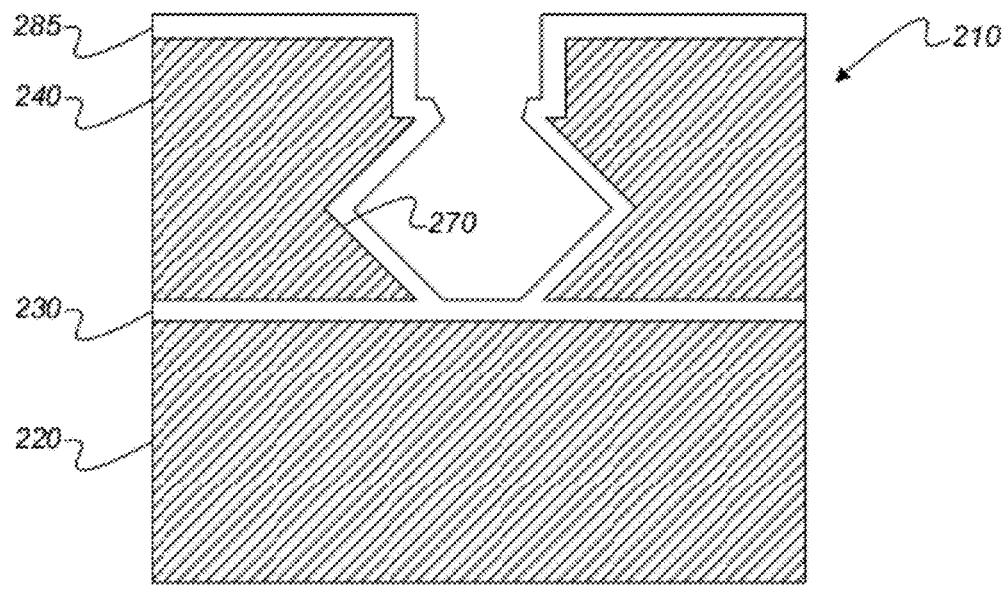

Forming a nozzle plate for a fluid ejection device includes forming a number of nozzles each having a cylindrical bore section and a tapered section. One difficulty in forming such a feature with this shape is aligning the cylindrical portion of the nozzle with the tapered portion. Methods for performing the etch of both the cylindrical portion and the tapered portion from a single side of a layer are described that can eliminate the alignment problems encountered when the cylindrical bore is etched from a side of the layer opposite to the tapered recess.

Referring to FIG. 1, a silicon-on-oxide ("SOI") wafer 10 has a layer of a single crystal material, such as a silicon layer 40, a handle layer 20 and an oxide layer 30 between the silicon layer 40 and handle layer 20. The silicon layer 40 can have a <100> crystal orientation. The handle layer 20 can be formed of silicon. A second oxide layer 50 is on a side of the silicon layer 40 opposite to the handle layer 20. Optionally, a third oxide layer (not depicted) is on a side of the handle layer 20 opposite to the silicon layer 40. While the layers can have just about any thickness, the oxide layers 30, 50 are thinner than the silicon layer 40 and handle layer 20. In an exemplary SOI wafer 10, the oxide layers are less than a few microns thick, such as about 1 micron thick. The handle layer can have a thickness of greater than 200 microns, such as about 600 microns. The silicon layer 40 has the thickness of the final desired thickness of the nozzle plate. Here, the silicon layer 40 is about 30 microns thick. In other embodiments, the silicon layer 40 is about 50 microns. Only a portion of a wafer 10 is shown in the figures for the sake of simplicity. That is, the creation of a single nozzle is shown, but in most cases a plurality of nozzles will be formed in a plurality of nozzle plates formed in the wafer 10.

Referring to FIG. 2, a layer of photoresist 65 is applied to the oxide layer 50 that is over the silicon layer 40. The layer of photoresist 65 is patterned to create a square hole 73. The photoresist layer 65 with the square hole 73 is used as a mask for etching a hole 75 into oxide layer 50, as shown in FIG. 3. The layer of photoresist 65 is then stripped from the wafer 10, as shown in FIG. 4. A second layer of photoresist 85 is applied to the top of the etched oxide layer 50. Referring to FIGS. 5-6, the second layer of photoresist 85 is patterned with a circular hole 77. A stepper can be used to perform precise alignment of a mask to a target on the wafer, such a stepper can have an alignment accuracy of about 15 nm. As shown in FIG. 7, the second layer of photoresist 85 is used as a mask to etch into the silicon layer 40, thereby forming a cylindrical hole 83. The cylindrical hole 83 can be formed, such as by using a dry reactive ion etching method, such as a low frequency etch process that does not undercut, for example, the Bosch process. The silicon oxide layer 30 acts as an etch stop during the etching of silicon layer 40. The second layer of photoresist 85 is then stripped, as shown in FIG. 8. Silicon nitride ($Si_3N_4$) could alternatively be used in layer 30 or layer 50.

As shown in FIG. 9, a thin silicon nitride or silicon oxide layer 91 is applied over the oxide layer 50 and on the sidewalls of hole 83 and the bottom of hole 83. In some embodiments, the thin oxide layer 91 is a thermal oxide layer that is grown using a furnace or silicon nitride deposited using low pressure chemical vapor deposition. The thin oxide layer 91 can have a thickness of about 0.5 micron and can be thinner than oxide layer 50. Because the etched oxide layer 50 leaves a portion of silicon layer 40 surrounding hole 83 exposed, the effect of forming oxide layer 91 is to create a thin region of oxide that has a square perimeter surrounded by a thick layer of oxide.

Some of the oxide is then removed from horizontal surfaces of the wafer by an anisotropic process such as dry etching, as shown in FIG. 10. The oxide removal is performed until the square shaped region of thin oxide surrounding the cylindrical hole is removed and allows the silicon layer 40 to be exposed in the square region. Oxide is also removed from the bottom of the cylindrical hole. In some embodiments, the thickness of the original oxide layer 50 remains at the bottom of the cylindrical hole 83. The oxide on the sidewalls of the cylindrical hole remains intact.

As shown in FIG. 11, a wet etch is then performed, using the remaining oxide from oxide layer 50 on top of silicon layer 40 as a mask. The anisotropic etch, for example, a tetramethylammonium hydroxide (TMAH) or potassium hydroxide (KOH) etch, stops on the 111 crystal plane to form angled sidewalls 101 in the square region that is devoid of oxide around the cylindrical hole. This forms the tapered region of the nozzle. In some embodiments a dry etch could be used to form the taper and not necessarily stop on the <111> crystal plane. In some embodiments, this etch step leaves a cylindrical tube of oxide 97 in the center of a square pyramidal shaped recess in the silicon layer 40. A picture of the etched feature in FIG. 12 shows a tube of oxide material and angled sidewalls 101.

Referring to FIG. 13, the cylindrical tube of oxide 97 is removed with an oxide wet etch, such as a hydrofluoric acid etch or a buffered oxide etch. If silicon nitride is used as the material 97 in FIG. 10, the silicon nitride can be removed with hot phosphoric acid. The cylindrical portion 103 of the feature has walls that are substantially perpendicular to a bottom surface 105 of the silicon layer 40 and meet the sidewalls 101. Because these features can form nozzles, the silicon layer 40 can form a nozzle plate. Referring to FIG. 14, the nozzle plate can then be attached to a device body 130. The device body 130 can include descenders 132. When the device body 130 is aligned with the etched silicon layer 40, the descenders 132 are aligned with nozzle features 134. The device body 130 and silicon layer 40 are bonded together, such as with an adhesive or a silicon to silicon bond. Suitable device bodies and adhesive methods are described in U.S. Publication No. 2005-0099467, published on May 12, 2005, which is incorporated by reference herein for its disclosure and figures. The handle layer 20 and any oxide or nitride layers can be removed, such as by grinding, polishing, or dry etching. In some embodiments, a final oxide layer 33 can be applied to exposed surfaces, such as a layer 0.4 or 0.5 micron thick, as shown in FIG. 15.

In another embodiment of forming a nozzle plate with nozzles, an SOI wafer 210 is provided that has a handle layer 220, an oxide layer 230 on the handle layer, a silicon layer 240 on the oxide layer 230 and an oxide layer 250 on the silicon layer 240, as shown in FIG. 16. This process can use materials and techniques that are similar to those described above. For example, this SOI wafer 210 can have the same layers and thicknesses as mentioned above for SOI wafer 10. A circular hole 255 is etched into oxide layer 250, as shown in FIGS. 17 and 18.

Referring to FIG. 19, the hole 255 is used as a mask to etch into silicon layer 240. The etch that is performed only extends part way through the total thickness of the silicon layer 240. The depth of the etch is controlled by timing the etching process. The etch depth is determined by determining the length of the straight walled, i.e., cylindrical, portion of the bore that is desired. An oxide layer 270 is then applied to the bottom and sidewalls of cylindrical hole 265 and on top of the remaining oxide layer 250.

Referring to FIG. 20, an oxide etch is performed to remove oxide from the bottom of cylindrical hole 265. This also removes some of the oxide thickness from over the silicon layer 240. However, oxide remains on the top of the silicon layer 240 at this stage due to original oxide layer 250. The resulting layer is oxide layer 280. As shown in FIG. 21, the cylindrical hole 265 or tube in the silicon layer 240 is then extended down to the oxide layer 230, such as by performing a dry etch to form holes 267. The geometry of the hole 267 is now a cylindrical tube. While the walls of the cylindrical substantially form a right cylinder, the top of the cylinder is lined with oxide and the bottom is not.

Referring to FIG. 22, an anisotropic or wet etch is performed in hole 267 to create hole 269, which has a portion with angled walls 270. The portion of the hole 279 that is protected by the oxide layer 280 is not affected by the wet etch. Referring to FIG. 23, the oxide layer is stripped, such as by performing a buffered oxide etch. The silicon layer 240 can be cleaned and reoxidized to form oxide layer 285, as shown in FIG. 24. The oxide protects the structure from attack during a subsequent etch. This oxide layer can be removed, if desired, at a later step.

Figure 25:
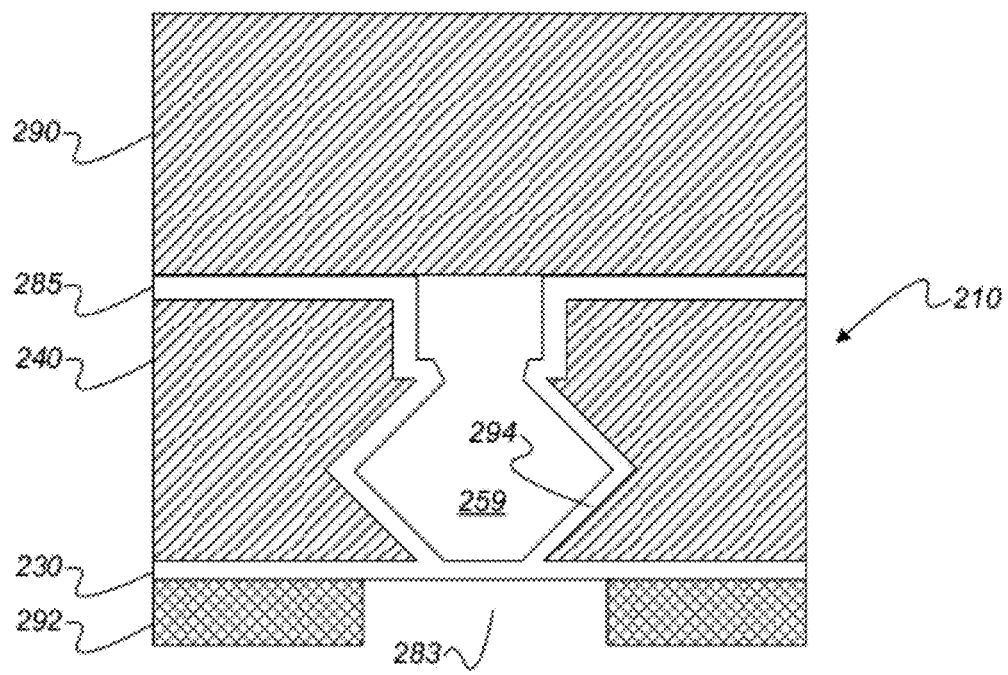

A top of the silicon layer 240 is then bonded, such as by direct bonding, to a sacrificial wafer 290, as shown in FIG. 25. The sacrificial wafer 290 can be formed of silicon. The silicon layer 220 can be removed from the back side of silicon layer 220. A layer of photoresist 292 is applied to the backside of the silicon layer 240. The photoresist is patterned with a hole 283. The hole can be a square hole. The edges of the hole align approximately with the greatest dimension or width of the hole 259, i.e., the hole formed by the anisotropic etch. The alignment does not need to be accurate. The silicon layer can be seen through the oxide layer such as with an infrared (IR) camera. This allows for alignment of hole 283 with hole 259. The hole 283 is then used as a mask and the silicon layer 240 is etched from a backside. The oxide layer 294 from inside the hole 259 is removed by a wet or dry etch. A portion 299 of the oxide layer 294 is not removed if the oxide is removed by a dry etch, as shown in FIG. 26.

Referring to FIG. 27, the photoresist 292 is removed and a device layer 130 is bonded to the backside of silicon layer 240. A descender 132 in the device layer 130 is aligned with hole 261. However, it is not crucial the that sidewalls of the descender are co-planar with the sidewalls of the hole 261. That is, the descender can be somewhat wider or narrower than hole 261.

Referring to FIGS. 28 and 29, a device body 130 attached to a nozzle plate 350, 360 that is formed according to the methods described herein is completed, such as by adding additional silicon layers and actuators 370. An actuator 370, such as a piezoelectric type actuator, is adjacent to a pumping chamber. Actuation of the actuator 370 when fluid is in the pumping chamber causes fluid to be expelled through nozzle 380. As shown, the descender is wider than the inlet of the nozzle.

When nozzles having a tapered portion that leads to a cylindrical outlet are formed where the taper is etched from one side of the substrate and the outlet is etched from the opposite side, it can be difficult to etch the outlet so that it is aligned with the tapered recess. The problem can be exacerbated by bowing in the SOI wafer or stress, stretching or compression that can be caused in the nozzle plate layer by attaching the SOI wafer to the device body. It can be very difficult to apply a mask and locally align each circular hole with a tapered inlet. That is, if the SOI wafer is bowed at all, it may be possible to align a mask with some of the circular holes on a substrate, but other holes can be out of alignment. Ideally, all of the holes across the substrate could be aligned with their respective tapered portions. Etching both the tapered portion and the circular portion using the same mask can eliminate this problem, particularly if one etched feature can create a location in which the other etched feature is etched. When both the tapered portion and the round bore portion are etched from the same side of the nozzle plate layer, an operator can visually inspect whether a mask to form one of the features is aligned with the features that are already formed. There is no need to guess whether all of the features are aligned. Also, because this method completes the nozzle etching prior to bonding the nozzle plate to the device body, if there are any defects caused by etching the nozzle plate, only the nozzle plate needs to be discarded, rather than the nozzle plate and the device body.

A number of embodiments of the invention have been described. Nevertheless, it will be understood that various modifications may be made without departing from the spirit and scope of the invention. For example, although circular nozzle outlets and cylindrical bores are described, the outlets and bores can have an oval shape or cross section or a bore with a rectangular or square cross section. Accordingly, other embodiments are within the scope of the following claims.

What is claimed is:

1. A method for forming a nozzle plate of a fluid ejection device, comprising:
   etching a first surface of a semiconductor layer to form a straight walled feature that extends vertically and only part way to an etch stop layer adjacent to the semiconductor layer;
   applying a protecting layer on sidewall surfaces of the straight walled feature;
   etching a bottom of the straight walled feature to extend the feature to the etch stop layer and to form a bore; and
   extending side surfaces of the bore to cause a portion of the bore to widen, wherein extending side surfaces of the bore includes performing an anisotropic etch and etching from a second surface of the semiconductor layer that is opposite to the first surface to form walls that are parallel to walls of the bore.

2. The method of claim 1, wherein the straight walled feature is round and the bore is substantially cylindrical.

3. The method of claim 1, wherein extending side surfaces of the bore includes forming walls that are not parallel to walls of the bore.

4. The method of claim 1, wherein etching a first surface of the semiconductor layer includes etching silicon.

* * * * *